(12) United States Patent
Wells (10) Patent No.: US 8,277,074 B2
(45) Date of Patent: *Oct. 2, 2012

(54) PORTABLE LIGHT APPARATUS AND METHOD OF ATTACHMENT

(76) Inventor: William K. Wells, Great Falls, VA (US)

( * ) Notice: Subject to any disclaimer, the term of this patent is extended or adjusted under 35 U.S.C. 154(b) by 263 days.

This patent is subject to a terminal disclaimer.

(21) Appl. No.: 12/618,652

(22) Filed: Nov. 13, 2009

(65) Prior Publication Data

US 2010/0182797 A1 Jul. 22, 2010

Related U.S. Application Data

(60) Provisional application No. 61/205,516, filed on Jan. 21, 2009.

(51) Int. Cl.
*F21L 4/00* (2006.01)
*H04M 1/22* (2006.01)

(52) U.S. Cl. .......................................... 362/191; 362/84

(58) Field of Classification Search .............. 362/84, 362/157, 183, 191, 800; 313/504, 511
See application file for complete search history.

(56) References Cited

U.S. PATENT DOCUMENTS

| | | | | |
|---|---|---|---|---|
| 5,479,325 A | * | 12/1995 | Chien | 362/105 |
| 5,858,561 A | * | 1/1999 | Epstein et al. | 428/690 |
| 5,915,824 A | | 6/1999 | Straat | |
| 6,231,205 B1 | | 5/2001 | Slesinger et al. | |
| 6,302,558 B1 | | 10/2001 | Parks | |
| 6,641,283 B1 | | 11/2003 | Bohler | |
| 6,936,964 B2 | * | 8/2005 | Cok | 313/512 |
| 7,207,689 B2 | * | 4/2007 | Tait | 362/156 |
| 7,950,819 B2 | * | 5/2011 | Wells | 362/157 |
| 2007/0064413 A1 | * | 3/2007 | Slater | 362/106 |
| 2007/0159819 A1 | | 7/2007 | Bayat et al. | |
| 2007/0283992 A1 | * | 12/2007 | Hennessy | 135/93 |
| 2009/0073692 A1 | | 3/2009 | Berger et al. | |
| 2009/0097234 A1 | | 4/2009 | von Malm | |

FOREIGN PATENT DOCUMENTS

| | | |
|---|---|---|
| KR | 20-0384990 | 5/2005 |
| KR | 20-0401234 | 11/2005 |
| KR | 20-2007-0001236 | 11/2007 |

* cited by examiner

*Primary Examiner* — Jason Moon Han (57) ABSTRACT

An organic light emitting diode system is sufficiently thin and poser efficient to permit its attachment to different configurations such as pocketbooks, brief bags, suitcases and the like. At least one side of the OLED material can have an attachment mechanism to facilitate attachment to a surface in the area to be lighted. The system may include a portable power source that provides electrical power to actuate the OLED material, causing it to generate light. A switch connected to the battery can control power to the OLED material to switch the light on and off. The switch can be manually operated or automatic. The low power consumption of embodiments of the OLED apparatus also provides for unique applications and uses.

12 Claims, 9 Drawing Sheets

PORTABLE LIGHT APPARATUS AND METHOD OF ATTACHMENT

CROSS-REFERENCE TO RELATED APPLICATION(S)

This application claims the benefit of priority to Provisional Application No. 61/205,516, filed on Jan. 21, 2009. The '516 application is hereby incorporated in its entirety by reference thereto.

BACKGROUND

1. Technical Field

Embodiments of the invention generally relate to lighting systems. In particular, embodiments relate to the design or use of portable lighting devices.

2. Discussion

Relatively portable lights heretofore have had significant shortcomings in their ability to accommodate different configurations without adversely affecting their operation. Many of these lights were difficult to employ and of a complicated design, rendering them of limited use in certain environments. Other types of lights were rather limited in size, which constrained the amount of light available for a particular space. In other designs lights were so large they were an impediment to portability. Certain flexible designs of the past required a single light source at the end of a fiber optic cable, which required precise orientation between elements to work properly. Others were not easily attachable to a bag or other surface to be lighted. Often the energy demands of these portable lights were prohibitive, requiring batteries to be replaced too often or use with a large power source that detracted from portability. Organic Light Emitting Diodes (OLEDs) have been developed, but without significant applications for commercial products. Often OLEDs have been considered laboratory matters of interest.

Although OLEDs have been disclosed before as light sources they have fallen short of the invention described and taught herein. An example is U.S. patent application Ser. No. 2009/0097234 entitled Illumination Device Luminaire and Display Device, published on Apr. 16, 2009, which names von Malm et al. as inventors. The von Malm publication relates to a specific device that includes certain reflection characteristics in addition to OLEDs. Von Malm references features of reflection when the OLED is not operating under a power supply, thus it falls short of disclosing the invention described and claimed herein.

For example, von Malm's reference OLEDs using a battery as a power source, with respect to FIG. 6, lacks an indication of what characteristics the battery should have or whether it should be used in the manner and combinations described herein. von Malm fails to disclose whether or not the battery is a low profile, light weight, high efficiency and of sufficient power to operate for months at time without replacement. von Malm also fails to disclose a switch that enables the system to be operated only when needed to generate light. von Malm also fails to disclose that the entire apparatus can be removed and re-attached as needed, which may be an advantage of embodiments of the invention. This portability benefit of embodiments of the invention may allow removal of the lighting apparatus when a garment is cleaned or when lighting is not otherwise needed.

Still further, to the extent a battery power source is referenced in von Malm, it appears to be integral with the object to which the OLED is to be attached. For example with respect to FIG. 5 of von Malm, the fastening elements of the bag contain a battery. Similarly, with respect to FIG. 6, the garment shown is described as having the power supply independently of the OLED. This is unlike the invention embodiments described where the switch, battery and OLED are entirely removable from the object to which it can be releasably attached. Consequently, the von Malm apparatus does not have the releasable feature, or the unitary nature of the invention described herein. Another feature of embodiments of the invention is the portability of all the elements needed to produce light. This provides a much more versatile system than disclosed in von Malm.

BRIEF DESCRIPTION OF THE DRAWINGS

The various advantages of the embodiments of the invention will become apparent by reading the following specification and appended claims, and by referencing the following drawings, in which:

DETAILED DESCRIPTION

Embodiments provide for an apparatus including an organic light emitting diode (OLED), a battery connected to the OLED, and a switch electrically connected between the battery and the OLED, wherein the switch can control or toggle the OLED between an on and off position. The apparatus may also include a fastener to removably secure the OLED material to a surface near an area to be subjected to light emitted by the OLED material. The battery may be removable from the apparatus for at least one of replacement and recharging. The apparatus may be portable and moved as a unit between applications as well as for use in different application.

Embodiments disclosed herein also involve a securing mechanism that may be affixed to a surface of an OLED, the securing mechanism permitting the OLED to be removably secured to a surface near an area to be illuminated by the OLED material. Part of this embodiment may include a battery compartment that may be attached to the securing mechanism with the switch electrically connected to the OLED. The switch may be integral with the battery compartments, the OLED and the securing mechanism, wherein, once attached to the desired surface, the switch may control power to the OLED material from the battery.

Embodiments may include a kit for installing a light fixture, where the kit may include an OLED, a battery, a switch, and a securing mechanism. Exemplary securing mechanisms might include hook and loop fasteners, snap fasteners, and/or adhesives.

Embodiments may include various types of equipment, particularly that which is used on roads, highways and other public areas at night. For example, a bicycle has numerous surfaces to which a specially designed OLED light apparatus can be attached. The OLED lighting apparatus can include an OLED material, a lightweight and low profile battery, a switch electrically connecting the battery and the OLED material, and a fastener to removably secure the lighting apparatus to an external surface of the bicycle. The switch may operate the OLED material between an on and an off position, and the battery can be removable from the lighting apparatus for replacement or recharging. The entire apparatus may be of a size and weight so that it does not substantially interfere with the normal operation of the bicycle.

Embodiments may also include a configuration for attachment of an OLED lighting apparatus to a garment to enhance visibility of the garment, particularly at night. The lighting apparatus can include an OLED material, a relatively lightweight, and preferably low profile battery connected to the OLED material, a switch electrically connected between the battery and the OLED material, and a fastener to removably secure the lighting apparatus to an external surface of the garment. The switch may operate the OLED material between an on and an off position, and the battery can be removable from the lighting device for replacement or recharging. Preferably the lighting apparatus is sufficiently flexible and has a profile to conform to the configuration of the garment, and is of a weight and size so that it does not substantially interfere with the activity of the user. The lighting apparatus can be worn by users who will be on highways at night, permitting them to be more easily seen by oncoming traffic. At night, firemen, police officers, highway workers, bicyclers, joggers and like wearing this apparatus all can be more readily seen by the OLED light produced with little or no impairment to the wearer. The light can be of various colors, such red, to indicate danger or other warning to oncoming traffic.

Another application can also be a home or office lighting of various enclosures such as book cases, closets, drawers and the like. The lighting apparatus can be attached to a structure with an external surface exposed to the area to be lit for example illumination of the interior of a closet. As noted, the lighting apparatus, can include an OLED material, a low voltage power source, such as a battery connected to the OLED, a switch electrically connected between the power source and the OLED material, and a fastener to removably secure the lighting device to the external surface of the closet structure. The switch may toggle the OLED material between an on and an off position, and the battery can be removable from the lighting device for at least one of replacement and recharging.

In addition, embodiments may include a suitcase, brief bag or like container with an internal surface and a lighting device coupled thereto for illumination of the internal space. In this or other environments, a battery and switch of the OLED light apparatus may be enclosed in a housing with a movable portion that permits access to the battery and switch.

Embodiments can also involve a method in which an activation event is wirelessly detected or detected through a hard wired connection and power is supplied from a battery to an OLED material in response to the activation event. The OLED light apparatus can be removably secured to a surface and the battery may be removably connected to the OLED light apparatus. For a wireless connection, the activation of the power source may be made through radio frequency, audio frequency, infrared or other light frequency. With this system the activation apparatus can be located more remote from the OLED light apparatus itself.

Figure 1:
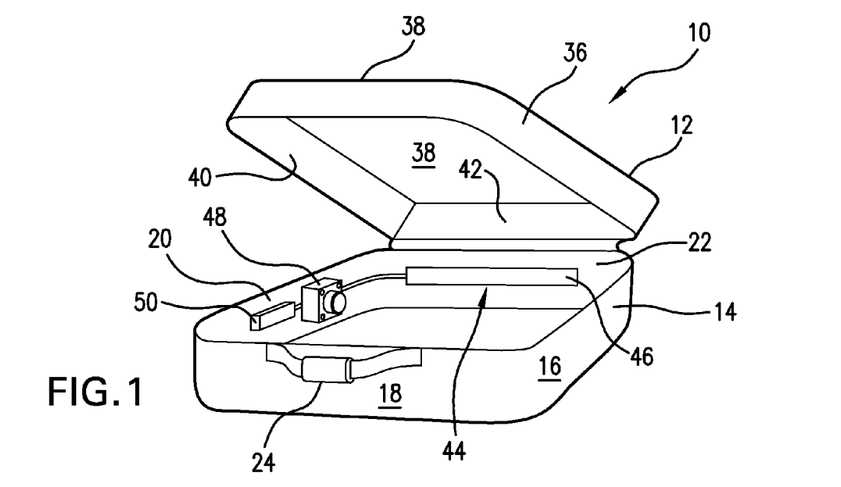
FIG. 1 is perspective view of an example of a flexible light as attached to a suitcase according to an embodiment.

One example of a portable lighting apparatus is shown in a specific application in FIG. 1, where flexible OLED light apparatus 44 of white light is attached to the interior of suitcase 10. The illustrated flexible OLED light apparatus 44 includes an OLED material strip 46, an attachment mechanism, a switch 48 and a battery 50 or other power source. Although the illustrated embodiment is described with white light, it could use any color or colors to accommodate a specific use. In some instances it may be preferable to have green light or a red light which can sufficiently light the interior of chest drawer, a shelf, a bag or case without being to obtrusive, at night, for example when a bright light may be objectionable.

The switch 48 in one embodiment may be a pressure switch that enables the user to depress the outer surface thereof to turn the light on and again to turn it off. Other types of switches could be used such as a touch switch, toggle switch, or the like. The switch 48 could include a sensor so as to automatically turn on the light when the bag is opened. Such switches are well known and include light sensors or mechanically operated devices which are actuated to turn the light on when the bag or suitcase is opened and turn the light off when it is closed. In this embodiment, the switch 48 is manually actuated so that it will actuate the light only when the user seeks to have the case lighted. Although the switch 48 as shown is electrically connected between the battery 50 and the OLED material 46, it could be located elsewhere so long as it is in a circuit that controls power to the OLED material. In this way the switch could be in a position remote from the battery 50 and the OLED material 46.

Figure 13:
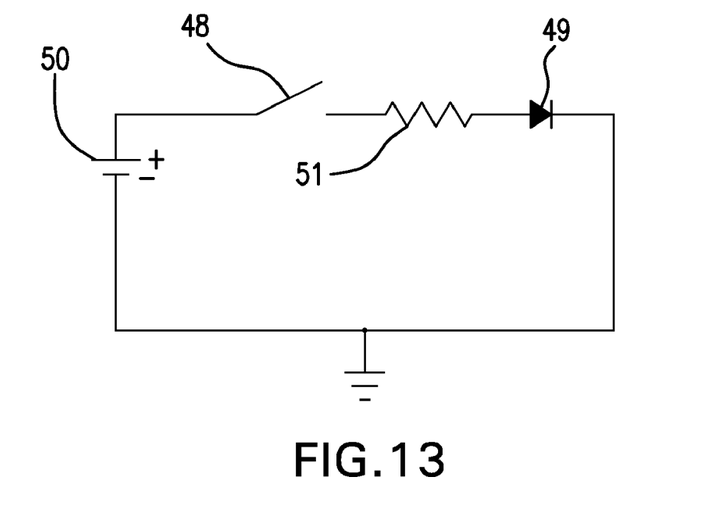
FIG. 13 is a schematic view of an example of a lighting circuit according to an embodiment.
Figure 14:
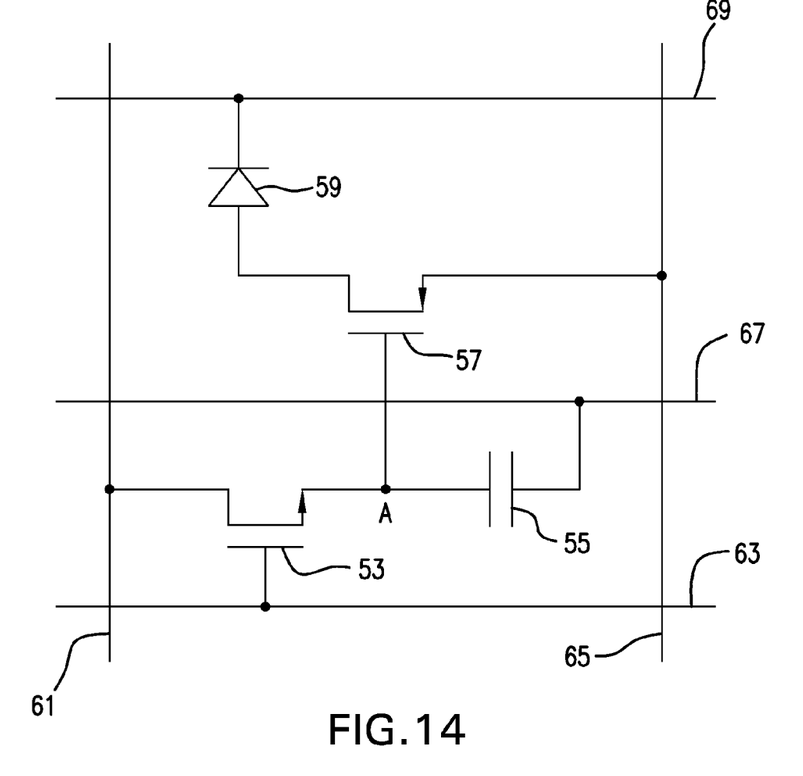
FIG. 14 is a schematic view of an example of an active matrix OLED apparatus according to an embodiment.

FIG. 13 shows an electrical schematic of a light system circuit in which power from the battery 50 is supplied to an OLED material 49 in response to detection of an activation event via the switch 48. The activation event could therefore correspond to a user depressing the switch 48, a door opening or a container such as a briefcase opening. Similarly, detection of a deactivation event, such as a user depressing (or releasing, depending upon the switch construction) the switch 48, a door closing, or a container such as a briefcase closing. The circuit may also include one or more current limiting resistors 51, and other passive or active components to provide for impedance matching, more stabilized operation, feedback, etc. The OLED material 49 may have a single diode configuration or an array configuration in which each diode represents a pixel of the array. FIG. 14 shows the circuit diagram of a portion of an active matrix OLED material array. In the illustrated example, the circuit includes a switching TFT (thin-film transistor) 53, a storage capacitor 55, a driving TFT 57, and an OLED 59. In addition, the circuit may include a signal line 61, a scan line 63, a power supply line 65, a capacitor line 67, and a common line 69.

The illustrated gate and source of the switching TFT 53 connect to the scan line 63 and the signal line 61, respectively. The drain of the switching TFT 53 may connect to the storage capacitor 55. A scan signal can be provided via the scan line 63 to control the state of the switching TFT 53. When the illustrated switching TFT 53 is in conducted state (or turned on), logic signals at the signal line 61 are transmitted to node A. In addition, the other terminal of the storage capacitor 55 connects to the capacitor line 67. Generally every capacitor line 67 of all pixel units in an OLED material array may be commonly connected. The logic signal at node A may be coupled to the gate of the driving TFT 57, and the source and drain of the driving TFT 57 may connect to the power supply line 65 and the anode of the OLED 59, respectively. The illustrated cathode of the OLED 59 connects to common line 69. When the logic signal at node A turns on the driving TFT 57, the path from the power supply line 65, driving TFT 57, OLED 59 to common line 69 forms a loop and the OLED 59 emits light. When the driving TFT 57 is not in a conducted state (turned off), OLED 59 will not emit light. In addition, generally every power supply line 65 and common line 69 of all pixel units in the OLED array may be connected together, respectively, wherein the power supply line 65 is coupled to a positive voltage, and the common line 69 is grounded. Other driving schemes such as passive matrix OLED array schemes may also be used.

Figure 3:
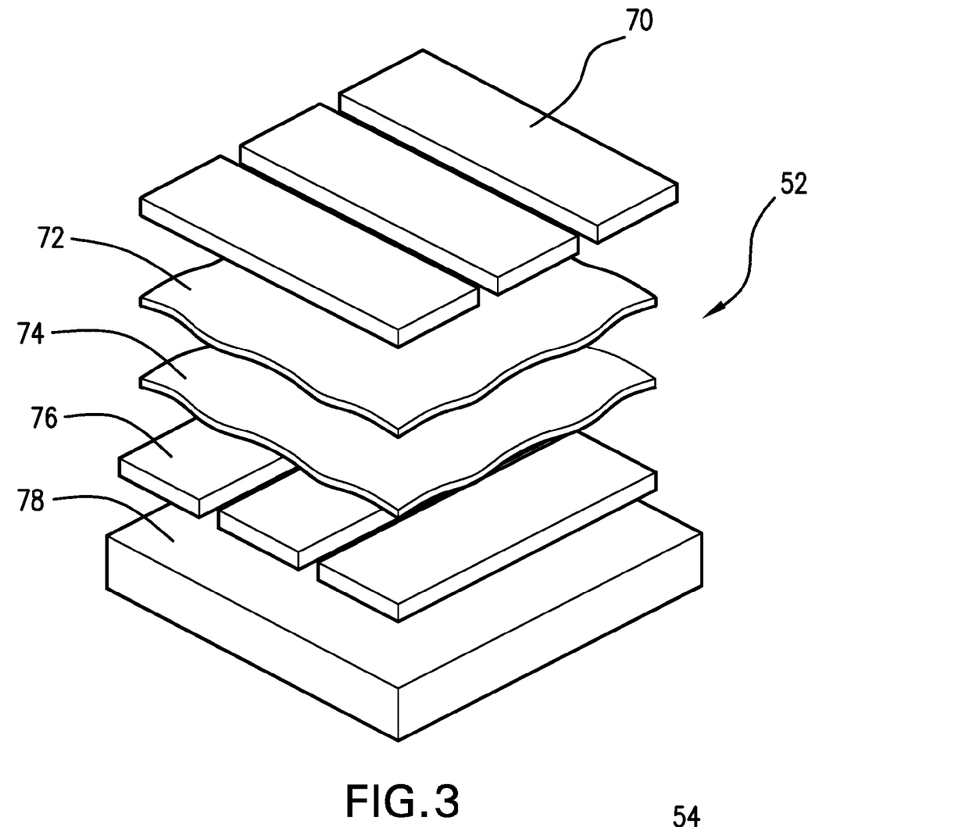
FIG. 3 is an exploded view of an example of an OLED material configuration according to an embodiment.

FIG. 3 shows an exploded view of an example of an OLED material 52 having an emissive layer 72 and a conductive layer 74 disposed between cathodes 70 and anodes 76. The emissive and conductive layers 72, 74 may include organic molecules or polymers, and the material 52 can be coupled to a substrate 78.

Returning now to FIGS. 1 and 2, the light system 44 includes OLED material strip 46, manual switch 48, and battery 50, as shown in the enlarged view of FIG. 2. OLED strip 46 can be removably attached to interior surface of rear wall 22 in bottom portion 14 of case 10. Top wall 18 of bottom portion 14 is opposed to rear wall 22 and connected thereto by opposed sidewalls 16 and 20. The illustrated switch 48 and battery 50 may be located on an interior surface of sidewall 20 and electrically connected to the OLED material strip 46 as shown. The case 10 can include an upper portion 12 that defines a top wall 38, an opposed bottom wall 42, two side walls 36 and 40 in opposed relationship that connect the top and bottom walls as shown. The length and width dimensions of bottom portion 14 and top portion 12 may be substantially identical so that, when closed the edges engage in complementary fashion as is well known for cases of this type. The top portion and bottom portion may have different depths. A handle 24 may be located on top wall 18 of bottom portion 14 for carrying the case when in the closed position.

Figure 2:
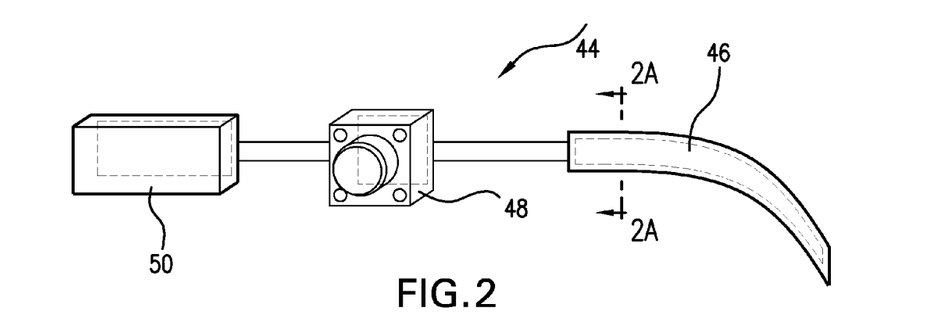
FIG. 2 is a schematic view of an example of a battery, switch and OLED material according to an embodiment.
Figure 2A:
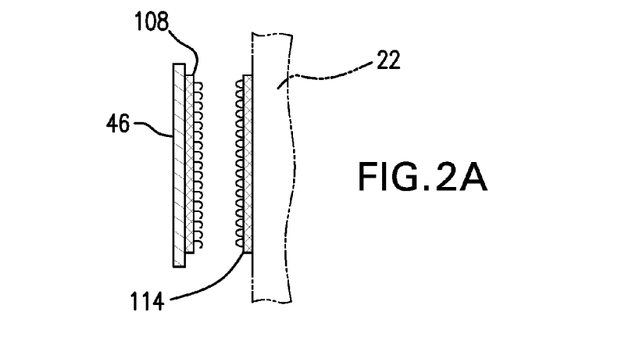
FIG. 2A is a cross-section of FIG. 2 along line 2A-2A.

As shown in FIGS. 2 and 2A, rear surfaces of strip 46, switch 48 and battery 50 may have a part of a hook and loop fastener for attaching the OLED light apparatus 44 to the interior surfaces of bag 10. A loop portion 114 of the hook and loop fastener is secured to rear wall 22, with loop portion exposed for engagement with complementary hook portion. Similarly, complementary hook portion 108 of the hook and loop fastener is secured to the rear surface of OLED material strip 46. The hook portion may extend substantially the entire length of the OLED material strip 46. This insures that it does not inadvertently peel away from surface 22 or otherwise interfere with contents of case 10. The illustrated switch 48 and battery 50 also have hook portions on their rear surfaces that cooperate with complementary loop portions fixed to surface 20 of case 10. In this way, the lighting apparatus can be removably attached to the interior surfaces of case 10 while taking up no significant space. The depth dimensions of the OLED material strip 46 and switch 48 may be less than 10 mm. The battery may be relatively thin as well as having a diameter of 22 mm and a thickness of 3.2 mm. The battery holder may be similarly thin, having a thickness of about 6 mm and a diameter of about 28 mm. The dimensions of the battery and switch can be up to 10 times larger and still have the advantages of the invention. The OLED material strip thickness may be 10 times greater or more and still have the advantages of the invention. The weight of the battery is about 2.9 g and can range between less than 1.5 g to about 10 g or larger. The holder may weigh about 1.7 g and can range between 0.95 g to 2.5 g and larger. The switch may weigh about 3.2 g and can range between 2.0 and 10 g and larger. The OLED has a weight of about 0.25 $g/cm^2$ and can range between 0.1 $g/cm^2$ and 0.5 $g/cm^2$ or greater.

The OLED material strip 46, as shown in FIG. 1, may be about 2.5 cm in width and about 15 cm long, which permits it to be easily attached to most brief bags, suitcases and pocketbooks. The strip 46 may be about 2 mm thick, but can have a depth dimension of as much as 10 mm and more depending on the layers of material comprising the OLED material strip. This sizing may permit the apparatus to provide sufficient light for the suitcase as shown when actuated. In an embodiment, the battery preferably should provide enough power to operate the OLED strip for about 600 hours of operation without significant degradation. In an embodiment, the light provided should range between 15 lm/watt to 50 lm/watt. The light may be as low as 10 lm/watt and as high as 100 lm/watt.

A tactile switch may be used with the other elements of embodiments. For uses where weight and size are a premium, both the switch and battery should be relatively small and of nominal weight. For example, the switch, as shown, is a 2.5 mm high tact switch of a single throw contact configuration rated at 50 mA, 12 VDC. Other switches may be used such as membrane tact switches, toggle switches, optical switches, rocker switches, coded DIP switches, touch switches, and snap-action switches. The touch switch can be a capacitance or a resistance type of switch which relies the change of resistance or capacitance caused by the touch of the human finger for example. Such switches come in various sizes to comply with the electronic requirements as well as the size specifications to fit in the environment where the apparatus will be used. An advantage of a touch switch may include that it can be sealed to avoid dust and other debris that could otherwise hamper its operation. Although a touch switch is preferable, other types of switches can be used as described above.

The battery 50 in this embodiment may be rechargeable and can be removed from the bag and charged as needed. Batteries that can be used for this purpose include Nickel Cadmium, Nickel Metal Hydride or any other battery that can be recharged upon depletion. Non-rechargeable batteries can be used as well such as alkali batteries and non-rechargeable Lithium batteries. The battery should preferably be matched to the OLED material to produce the desired amount of light to the internal part of the case.

Figure 5:
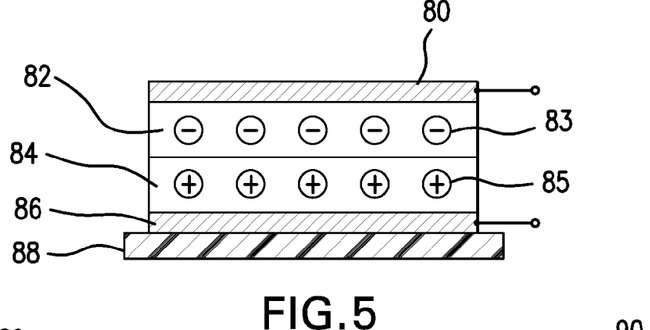
FIG. 5 is a schematic view of an example of an OLED material showing holes and electrons according to an embodiment.

Although OLEDs require little power, electrical current is needed to generate an acceptable level light. In FIG. 5, a schematic of an OLED material is shown to demonstrate its operation. On substrate 88, anode 86 and cathode 80 are arranged to engage conductive layer 84 and emissive layer 82 as shown. Once the proper voltage is established between the anode 86 and cathode 80, a current will flow between them. This gives electrons 83 to the emissive layer 82 and removes electrons form conductive layer 84. The resulting absence of electrons in the conductive layer creates holes 85 that eventually must be filled. When the holes 85 jump to the emissive layer 82 to recombine with the electrons, energy in the form of light is formed. With this structure, extremely thin materials can be produced that give off light at low power demands.

As OLEDs do not need much power, a battery can operate between about 3 and 6 volts and preferably between 3.6 and 4.8 volts. For example, a battery for operating the OLED material can be a CR2032 button type battery that is generally available. Any battery will suffice so long as it produces enough voltage to generate a current in the OLED to provide the desired amount of light without harming the OLED. It is preferable that the battery last a reasonable time before it must be replaced or recharged. For the use described herein the battery should be relatively small and thin to minimize space requirements.

Some degradation may occur over time before the battery needs to be replaced or recharged. A device having about 2000 mm$^2$ should provide sufficient level of light for 130 hours. When the battery is initially installed and actuated, it should provide about 4 milliamps of current. After 80 hours of use the current should be about no less than 1.1 milliamps. After 130 hours of use the current may drop to 40 micro amps which will still provide the necessary light for the intended use. In this case a 3.6 volt battery should meet the criteria. As the average lamp is operated for 3 hours a day, at 1.1 milliamps it can operated for 26 days before it needs to be recharged. If the OLED apparatus is used with a brief bag, pocketbook or the like, where it is operated for minutes at a time, the battery can last for months before it need be recharged or replaced.

For recharging the battery, conventional recharging devices can be used so long as they are compatible with the batteries used in the invention. Particularly because the batteries use so little power, solar chargers can be used to recharge the batteries once depleted. Relatively small solar charger apparatus have sufficient power to charge a 3 volt battery in a matter of hours, about 4 hours or less. A relatively small portable solar charger relies on sunlight to recharge an internal battery. That solar charger is then simply connected to the OLED battery in a conventional manner to recharge the device for use with the OLED lighting apparatus. Numerous solar panels of different designs can be employed for this purpose. One such device is the Solio® Hybrid Solar Charger™ which is comprised of three expandable solar panels and receptacles for receiving tips of charging cables. The Solio® device includes rechargeable Lithium Ion battery 3.7 volts, 1650 mAh. The rated output is 1.5 to 5.5 watts. The panels can produce a maximum output of 0.85 watts.

The OLED material in this case is made up of at least 5 layers, but may include more. As shown the OLED is comprised of a substrate, an anode, a light emitting layer, a conductive layer and a cathode. Once a voltage is applied across the anode and cathode a current is generated that causes light to be emitted across the entire length of the OLED strip. U.S. Pat. No. 7,453,200 entitled White-light Organic Light-emitting Diode (OLED) and its Fabrication issued on Nov. 18, 2008 to Jou and Sun (hereinafter the '200 Patent) show a multilayer device that can be used as an element of the invention and is incorporated herein in its entirety. FIG. 1 of the '200 Patent shows a six layer OLED and in FIG. 2 there is shown a five layer device that may be implemented in one or more embodiments. Either of these configurations will suffice for the purpose described herein. If the configuration is flexible, can operate with a battery and is adaptable to being manufactured with other elements as a removable device, it may appropriate for embodiments of the invention described herein. But for many applications that utilize embodiments of the invention, a substantially rigid device can be used.

Whether or not the apparatus is flexible revolves at least in part around the type of substrate used for the OLED structure. For certain embodiments of the invention described herein, it may be preferable to utilize flexible elements which require the substrate in particular to be of a flexible material. For this purpose stainless steel sheets or foil and ultra-thin glass sheets which are not as flexible as some plastics, will suffice for many uses. Highly flexible plastics are preferable such as PET and PEN polyester films. A combination of materials can also be used, such as a plastic laminated to or coated on a thin aluminum foil.

The flexible OLED material can be utilized in various sizes and shapes. In one embodiment, the material is in the form of a strip of about 20 inches long and about one inch in width. The strip could be longer, shorter, wider or narrower as the user required to cover the space by light emitted from the apparatus. As the surface to which the OLED can be affixed may be not be rigid, such as a pocket book or soft luggage, the flexible feature permits the strip to conform to but the surface minimizing the space needed for the apparatus.

Figure 4:
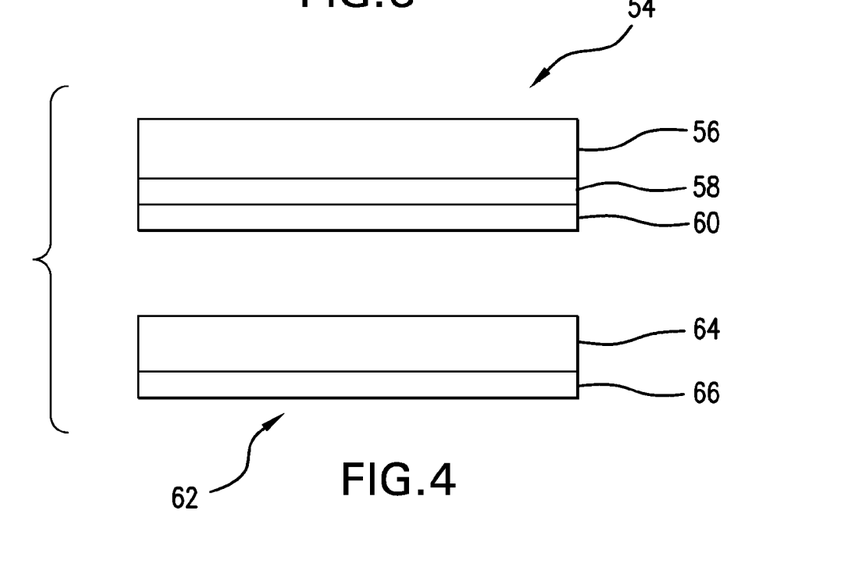
FIG. 4 is an exploded view of an example of an OLED material as attached to a hook and loop fastener according to an embodiment.
Figure 7:
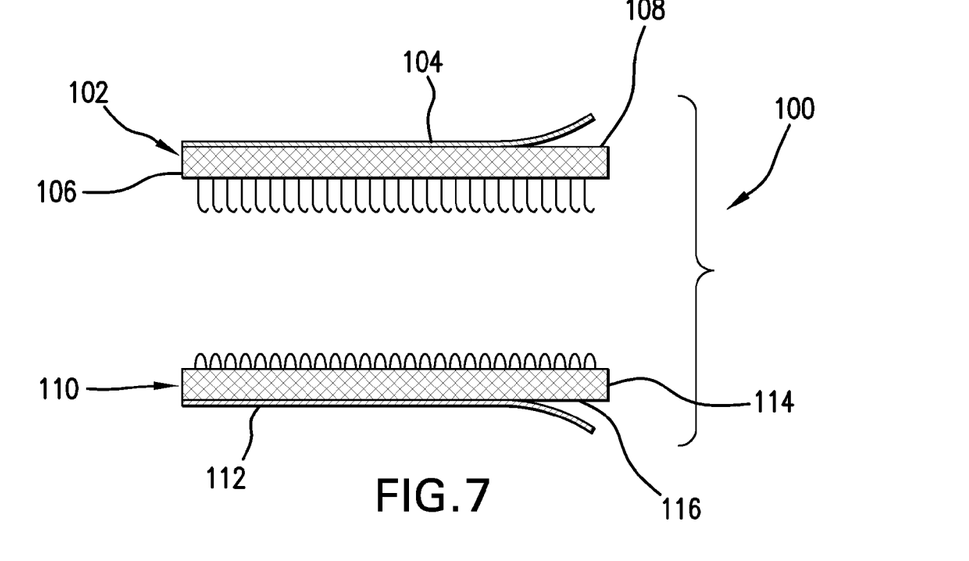
FIG. 7 is an exploded cross-sectional view of an example of a hook and loop fastener according to an embodiment.

FIG. 4 demonstrates that the first part 54 of the light apparatus may include the rear surface of the OLED material 56 adhered with an adhesive layer 58 to a flexible strip of hook material 60 that is part of a hook and loop fastener as shown in FIG. 7. The complementary part 62 of the fastener is a strip of loop material 64 that has an adhesive backing 66 to secure the complementary part to an exposed surface of the suitcase or other bag. Once the complementary loop portion 62 is secured to a surface of the case or bag; the hook portion can simply be pressed against the loop portion to secure the OLED strip in place as shown. If the OLED must be replaced, first part 54 can be peeled away from the complementary loop portion 62 and replaced.

Hook and loop fasteners for this purpose are well known and are sold under the Velcro trademark. For example, Tessco Technologies Incorporated of Hunt Valley, Maryland sells a Velcro® fastener, product no. 18072, as a one inch wide tape in 25 yard lengths with a peel away backing. Once the backing is peeled away, an adhesive is exposed for attaching the fastener portion to the desired surface. An enlarged view of the hook and loop fastener is shown in FIG. 7 with a portion of backing peeled away. In particular, a securing mechanism 100 may include a hook portion 102 and a loop portion 110. The illustrated hook portion 102 has a substrate 106 with a backing 104 applied to a surface 108 of the substrate 106. Similarly, the loop portion 110 can have a substrate 114 with a backing 112 applied to a surface 116 of the substrate. The substrates 106, 114 can also have mating hook and loop configurations to ensure removable coupling between the two components.

The suitcase, brief bag or pocketbook can be manufactured with the OLED light apparatus already in place. In this instance, only the battery need be replaced or recharged when it is depleted. In the alternative the OLED light apparatus is manufactured as a kit with all of the elements needed to attach the OLED, battery and switch to the desired surface. The kit may be comprised of the OLED strip, with the hook portion of the Velcro® fastener already adhered to the OLED material, the battery, the switch, and a loop portion of the Velcro® fastener is a separate item. The film of the loop portion is peeled away, exposing the adhesive surface, and the loop portion is then pressed against the surface of the suitcase to fix it thereto. The battery and switch, having a hook portion on their rear surfaces, can then simply be pressed on the hook portion of the Velcro® fastener strip. Battery and switch can be separate items, or can be part of a continuous substrate to which the OLED material is formed or attached. In either case, the battery is removable for replacement or recharging.

Figure 6:
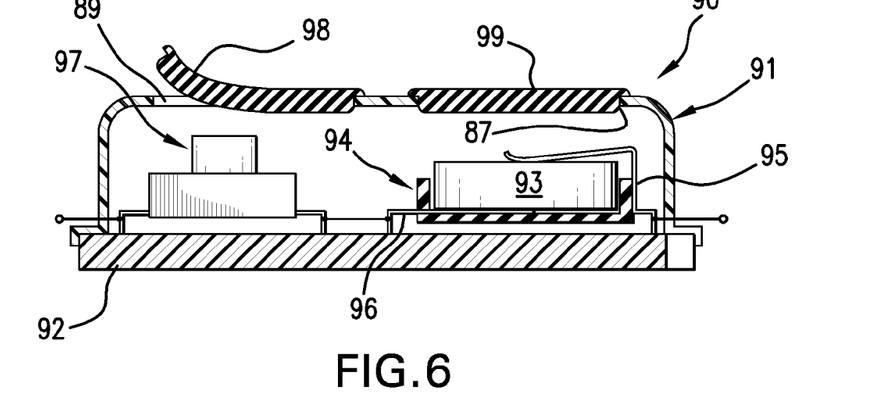
FIG. 6 is a cross-sectional view of an example of a power unit including a switch and battery according to an embodiment.

FIG. 6 shows a power unit 90 that includes a planar substrate 92 of non-conductive material on which the battery 93 and tactile 97 switch are mounted. A battery receptacle 94 that is generally cylindrical with a recess for receiving the battery. A spring loaded cathode 95 is arranged to engage the battery 93 and bias it toward and engage anode 96 exposed in the upper surface of the recess of the housing. Wires as shown connect the anode 96 and cathode 95 to the switch 97 and ultimately to the OLED strip. A rigid housing 91 fits atop the substrate 92 and completely covers the battery 93 and switch 97 in this embodiment. Housing 91 includes a first flexible movable cap 98 that in a closed position covers an access aperture 89 above switch 97. Similarly a second flexible movable cap 99 in a closed position covers access aperture 87 over battery 93. This configuration serves a dual purpose of protection and operation. The caps 98 and 99 are movable between a closed and open position. The aperture 87 is sufficiently large to permit the user to replace the battery when necessary. Aperture 89 is larger than the diameter of the battery 93 and permits the user to change the battery there through. In the closed position the housing 91 and caps 98 and 99 cover the battery and switches and protect them from inadvertent actuation or other engagement by external means. Cap 98 can be peeled away partially to actuate switch 97. Cap 99 can be peeled away to expose battery 93 when it is necessary to replace or recharge the battery.

Figure 8:
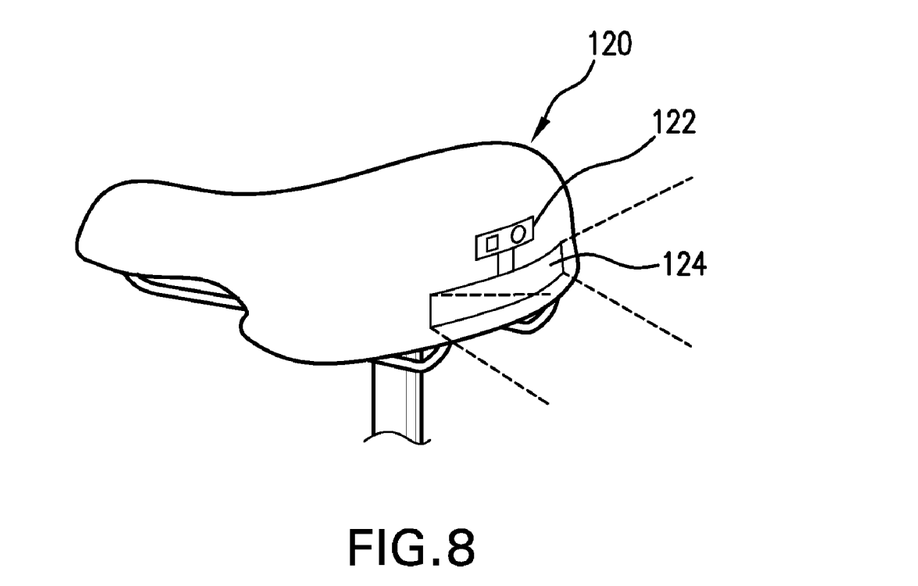
FIG. 8 is a perspective view of an example of a bicycle seat with an OLED light apparatus according to an embodiment.
Figure 9:
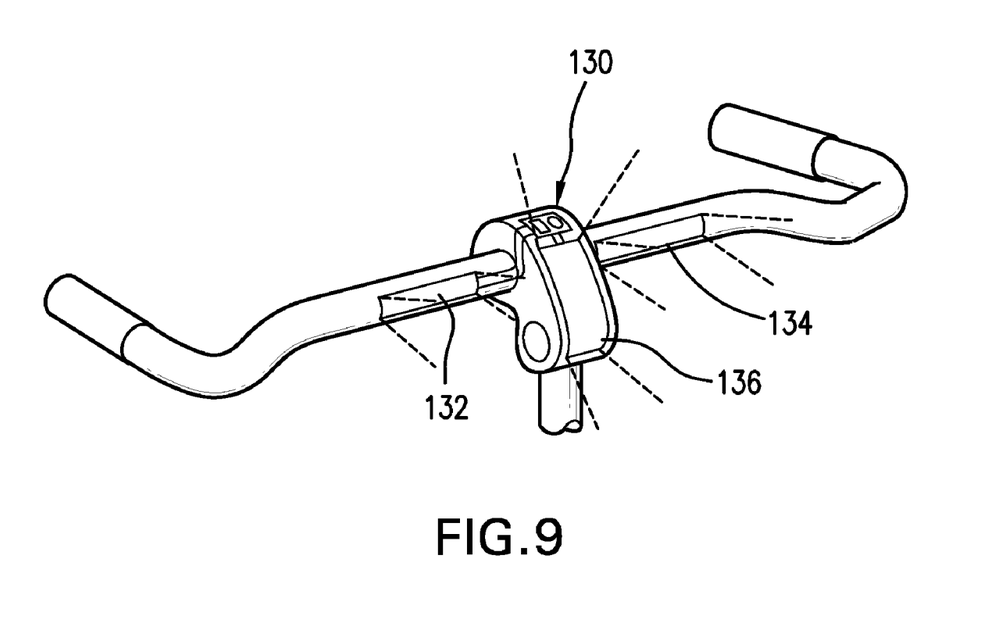
FIG. 9 is a perspective view of an example of bicycle handlebars with a light apparatus according to an embodiment.

Flexibility, size and operation permit the use on many objects which heretofore would have impeded the application of lighting apparatus. For example in FIG. 8 there is shown a bicycle seat 120 with a flexible OLED light 124 secured to the rear surface thereof. A power unit 122 is affixed to the seat just above the OLED light 124 and connected thereto to control its operation. Similarly multiple strips of OLED material can be used with one power source in an unobtrusive way to provide the desired level of light. As can be seen in FIG. 9, three strips of OLED material 132, 134, and 136 are affixed to the handlebars and center post as shown. These strips are electrically connected to a power unit 130, such that one battery and switch can control all three strips of lighting material.

Figures 10, 10A, 11:
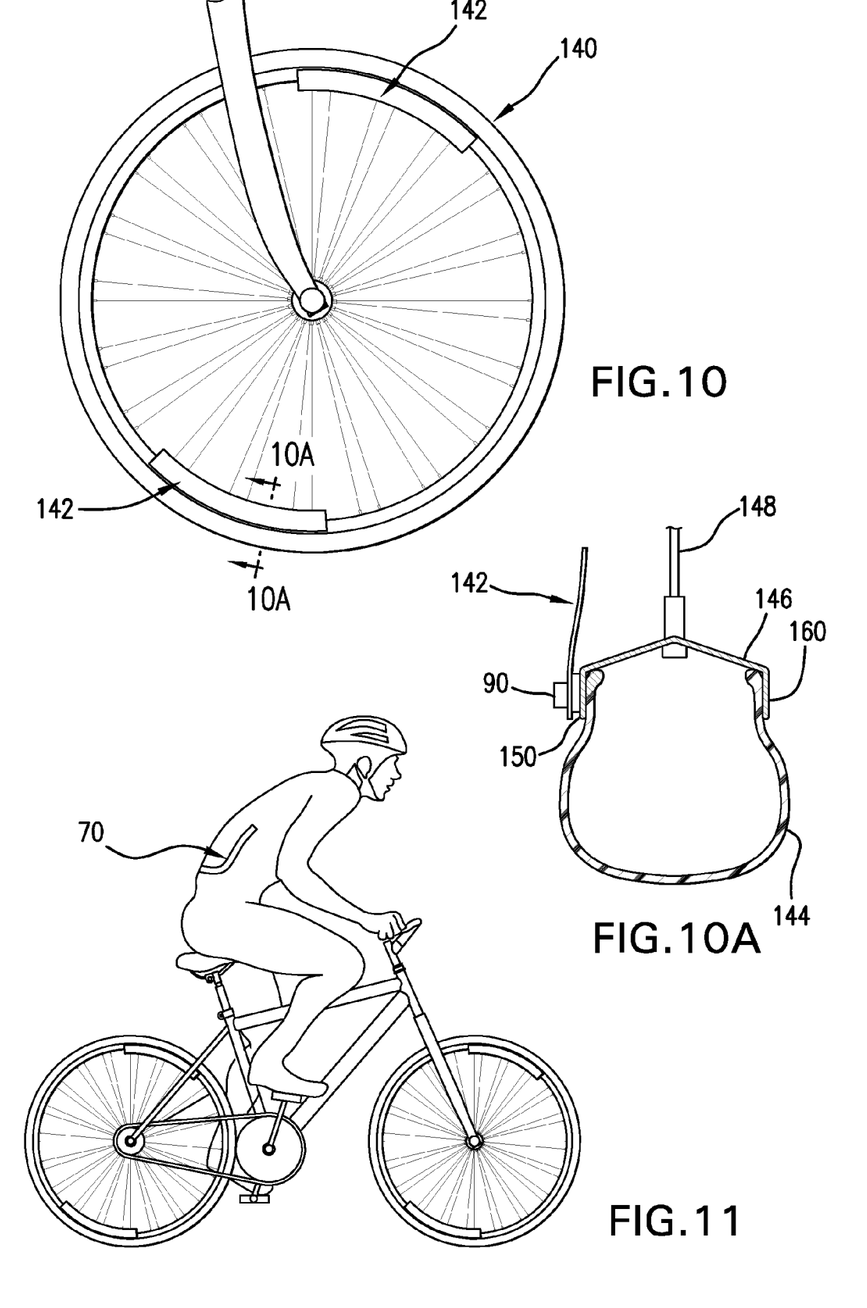
FIG. 10 is a side view of a bicycle wheel with an OLED material light thereon according to an embodiment.
FIG. 10A is a cross-section of FIG. 10 along line 10A-10A.
FIG. 11 is a side view of an example of a biker with an OLED light apparatus on a garment according to an embodiment.

OLED is practically unlimited to the shape or form it can take for lighting various types of equipment. As shown in FIGS. 10, 10A and 11, actuate OLED lighting strips 142 are arranged on the rim 146 of bicycle wheel 140. In this embodiment, two OLED strips 142 are located opposite each other on the outer rim of wheel 140. Rim 146 connects tire 144 to spoke 148 as shown. Exposed edge 150 of rim 146, to which tire 144 is fixed, is connected at its apex to bottom of spoke 148. One edge 150 an OLED lighting Strip may be fixed in the same manner as describe above with respect to FIG. 2 without interfering the spokes 148. In this embodiment, a power unit 90 may be secured to the outer surface of strip 142. In this way an OLED material that generates red light can be employed so that when powered, various parts of a bicycle can be brightly illuminated for night riding. Since the OLED material in this embodiment is so light it has almost no effect on the operation of the bicycle, particularly when two are used to balance the wheel 140 as shown in FIG. 10.

Figure 11A:
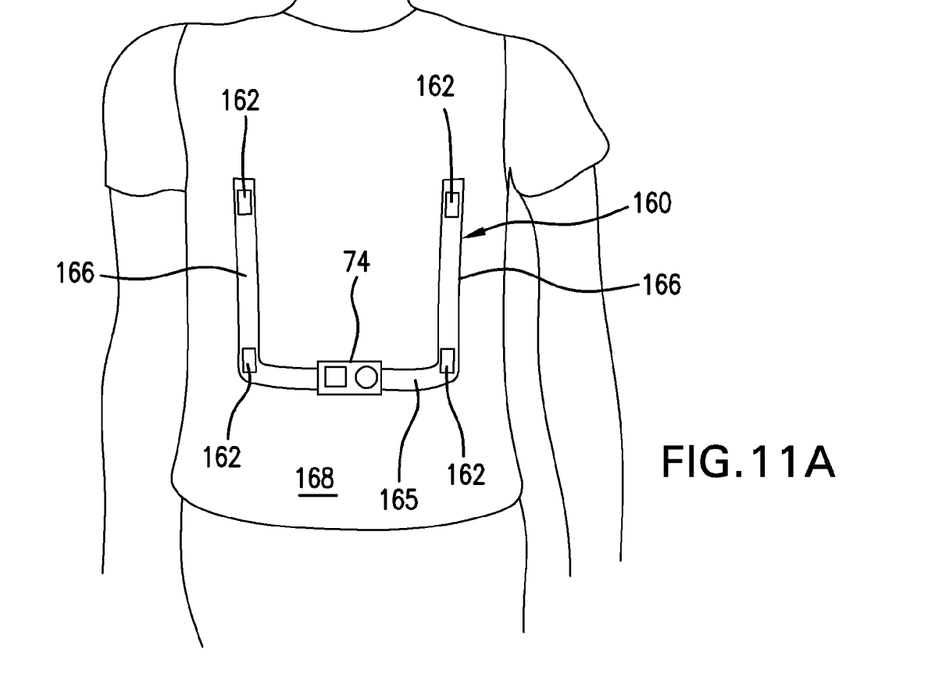
FIG. 11A is an enlarged view of a portion of FIG. 11.
Figure 11B:
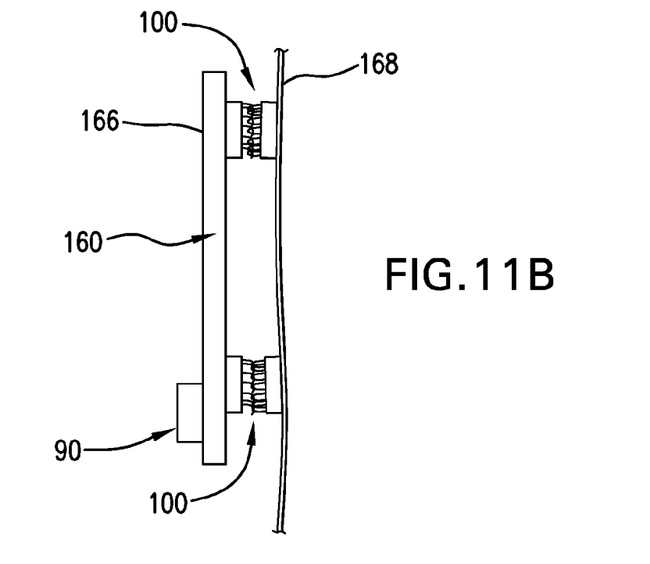
FIG. 11B is a side view of the OLED light apparatus of FIG. 11A.

Flexibility permits the OLED lighting material to be used on clothing as well as other types of apparatus. For, example in FIG. 11A, a "U" shaped OLED material lighting strip 160 is designed to be attached to a shirt 168 worn by a jogger. Strip 160 includes two opposed vertical legs 166 connected at one end by lateral strip 165. In the middle of strip 165 is a power unit 74 comprising a battery and switch as described in FIG. 6. Hook and Loop fasteners 100 may be located at or near the upper ends of vertical strips 166 and lower end of strips 166 adjacent lateral strip 165. It is preferable to also have a hook and loop fastener in the middle of lateral strip 165 for fastening it to shirt 168. As discussed above with respect to FIG. 6, each fastener has a loop portion with a peel away strip that exposes a rear surface with an adhesive thereon for attaching the loop portion to the surface of shirt 168. The hook portion also has a peel away strip that exposes an adhesive surface for attaching the hook portion to the rear surface of the "U" shaped OLED strip 160. With this configuration, when the OLED light is not required, the OLED strip 160 can be removed from shirt 168 by peeling off one portion of the hook and loop fastener of each fastener 162. The complementary part of the fastener remains on shirt for future use.

The mechanism described above for attaching an OLED strip to a surface is not limited to a particular fastener. Various adhesives can be used between the substrate and the surface in lieu of hooks and loop fasteners. Such adhesives can be permanent or temporary.

Figure 12:
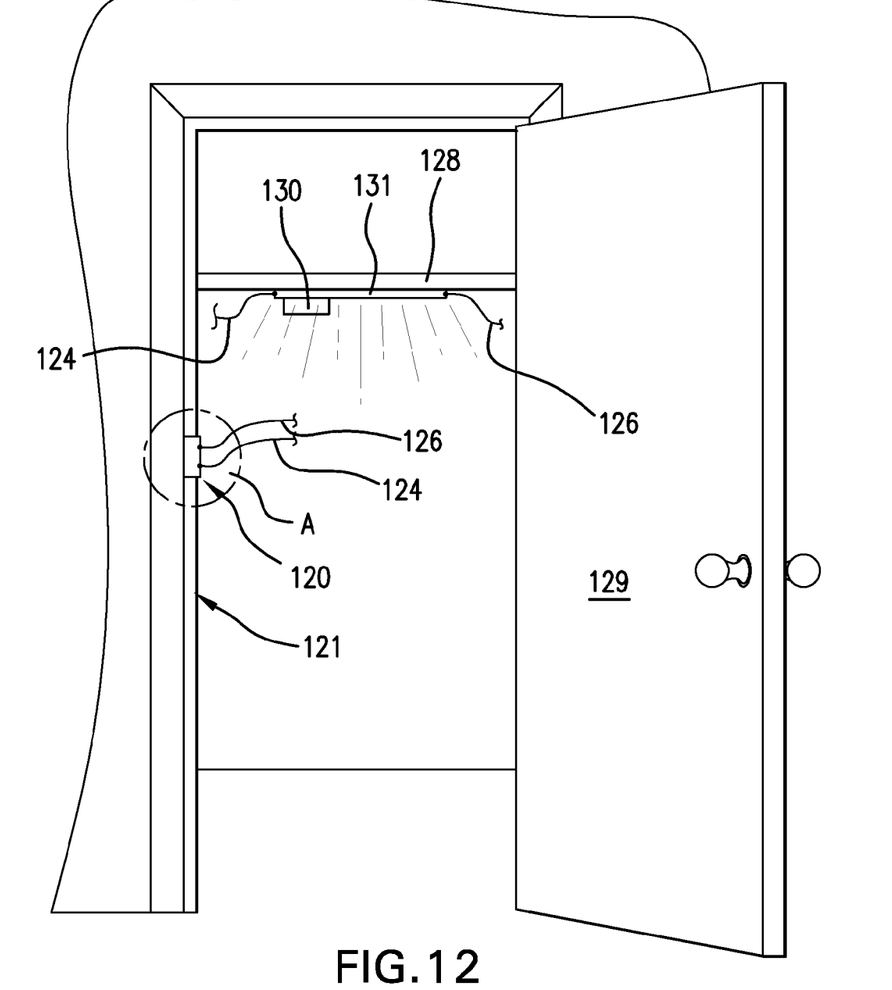
FIG. 12 is a perspective view of an example of a closet with an OLED light apparatus and an automatic switch according to an embodiment.

The mechanism can be automatic, eliminating the need for manual actuation of the switch. In this way the OLED can be energized when doors, closets, suitcases or pocketbooks and the like are opened and de-energized when closed without the need for human intervention. As shown in FIG. 12, switch 120 is arranged on the door jam 121 to be actuated by door 129. OLED material strip 131 with battery 130 may be fixed to the underside of closet shelf 128. Switch 120 may be connected to battery 130 via wires 126 and 124. When the door is in a closed position, switch 120 may be actuated to the "off" position. When door 129 is opened, switch 120 may be actuated to the "on" position where battery is electrically connected to OLED strip 131 causing it to emit light.

Figure 12A:
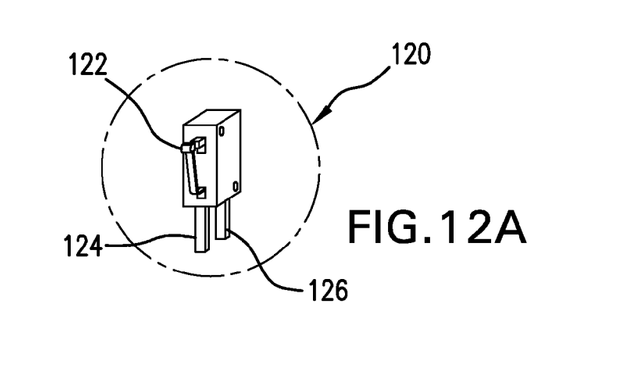
FIG. 12A is an enlarged view of the switch of FIG. 12.

As can be seen in FIG. 12A, the switch for this purpose has a spring loaded roller lever 122 that is biased to the "on" position as shown. Switch is affixed to door jam so that lever 122 is engaged by door 129 to depress the lever and close the switch. Conversely, when door is opened the lever may be released, which opens the switch. That is, when the door is in the open position as shown in FIG. 12, switch 120 may move to the "on" position to permit the OLED strip 131 to be energized. When door 129 is moved to the closed position, it engages lever 122, moving it to the "off" position to de-energized OLED strip 131. Such is rated to operate in the current and voltage range for the OLED. Specifically in the milliamp range and 3 to 6 volt range the switch will operate as described above.

Figure 12B:
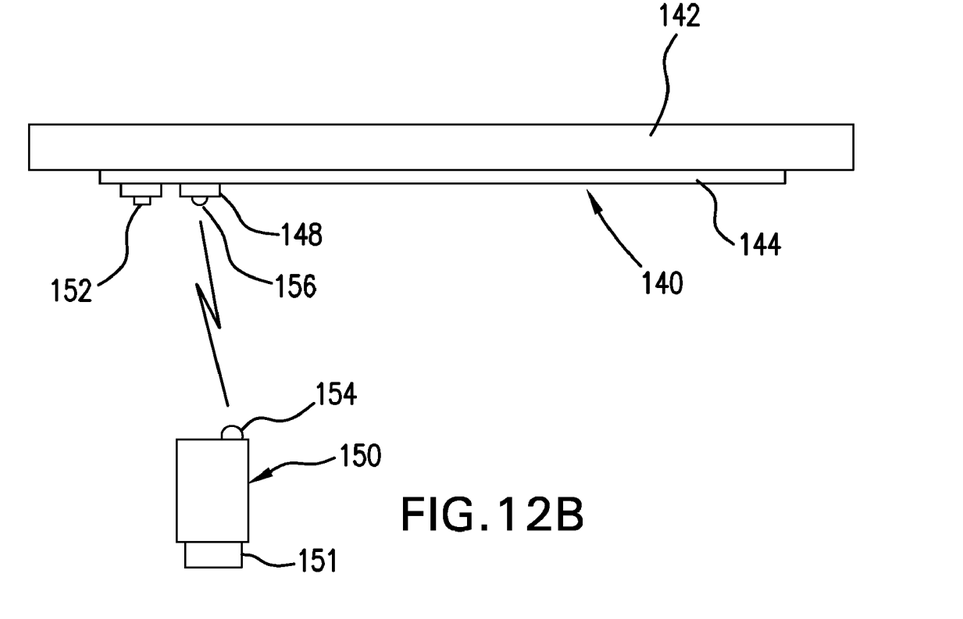
FIG. 12B is a side view of an OLED light apparatus activated by a light sensitive switch according to an embodiment.

Any switch that can be actuated by the door and operate in the ranges described above will suffice. Such switches can be of wireless variety for use in environments where installing wiring may be difficult. A wireless lighting apparatus 140 with shelf 142 is shown in FIG. 12B. The assembly includes light sensitive switch 148, battery 152, OLED strip 144 and emitter switch 150. Wireless emitter switch 150 includes a separate power source, such as a rechargeable battery, and an emitter 154 that emits a light beam that can be sensed by receiver 156 of OLED light sensitive switch 148. Emitter switch 150 is actuated between an "on" and "off" position by plunger 151. For this purpose, switch 150 has a separate power source battery 152 that provides sufficient power to operate emitter 154. When switch 148 is activated by sensing light from emitter 154, it switches to an "on" position to energize OLED strip 144. Emitter switch 150 is actuated by door 129 engaging plunger 151 between and "on" and "off" position. Plunger 151 may be biased toward an open position that causes emitter 154 to emit light when the door is opened. Conversely, when door 129 is closed, plunger 151 is engaged and moved to a closed position which corresponds to the "off" position of the switch 150. Once receiver 156 ceases receiving light, it will be switched to an "off" position, thereby interrupting current between battery 152 and OLED strip 144.

The elements of OLED portable lighting apparatus can be sold in forms for use in a wide variety of environments. Such a kit may include an OLED strip or strips, battery, battery holder, switch and Velcro fasteners as described above.

Embodiments of the present invention are applicable for use with all types of semiconductor integrated circuit ("IC") chips. Examples of these IC chips include but are not limited to processors, controllers, chipset components, programmable logic arrays (PLA), memory chips, network chips, and the like. In addition, in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques mature over time, devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The terms "coupled", "attached", "secured" and "connected" are used herein to refer to any type of relationship, direct or indirect, between the components in question, and may apply to electrical, mechanical, fluid, optical, electromagnetic, electromechanical or other connections. In addition, the terms "first", "second", etc. are used herein only to facilitate discussion, and carry no particular temporal or chronological significance unless otherwise indicated.

The portability and flexibility of various embodiments of the invention may provide for applications and uses not previously considered feasible. These uses may include mounting on garments without the need for garment based power systems. In other words the garment would not need its own power source to power the light. Rather, the power would be sourced from OLED apparatus itself.

Still further, embodiments of the invention may be located on delicate or fragile materials because of the self-contained nature of the apparatus and because of the ability of the attachment mechanism to distribute the load and the weight of the OLED apparatus over the entire surface area of the delicate or fragile material.

Still further, the low power requirements of embodiments of the OLED apparatus can facilitate the use of the OLED apparatus in applications not previously considered possible. For example, aircraft applications, where electronic noise created by unwanted electric fields may be an impediment to larger lighting systems, the OLED embodiments here can be possible because of the lower power consumption. Indeed, the low power consumption may provide for us directly in the cockpits of the aircraft to allow for illumination of seating and other areas. Similarly, the OLEDs may be used as back up illumination sources in and around sensitive electronic equipment, such as surgical equipment, sensing equipment, or telecommunication equipment, which may be sensitive to fields created by more powerful lighting sources.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims. Features of certain embodiments may be combined with other features from the other embodiments. Thus, the embodiments should not be seen as mutually exclusive or limiting in any way.

The following are examples of claims that the inventors are entitled. Other claims of different scope are expected to be obtained once a regular utility application is filed, and these claims should not be interpreted in any way to limit the scope of claims ultimately sought.

What is claimed is:

1. An apparatus comprising:
   a planar organic light emitting diode material having a length of least 5 cm and a width dimension being equal to or less than the length dimension, said organic light emitting diode material configured to have a low profile of less than 10 mm in thickness;
   a battery connected to the organic light emitting diode material for providing a voltage source of about 10 volts or less, said battery having a length and width dimension equal to or less than the organic light emitting diode material,
   a switch electrically connected between the battery and the organic light emitting diode material, the switch operable between an on and off position;
   a substrate to which said light emitting diode material, said battery and said switch are fixed;
      said substrate, said light emitting diode material, said switch and battery having a combined thickness of about 10 mm or less; and
   a mechanism for removably securing said substrate with the organic light emitting diode material thereon to a surface in an area to be subjected to light, wherein the battery is independently removable from the apparatus for at least one of replacement and recharging.

2. The apparatus according to claim 1, further comprising a holder for the battery.

3. The apparatus according to claim 2, wherein the battery provides a voltage between 2 and 10 volts to the organic light emitting diode material.

4. The apparatus according to claim 1, wherein the organic light emitting diode material is flexible.

5. The apparatus according to claim 1 wherein the organic light emitting diode material, the switch, the battery, the holder and the substrate form a low profile unitary device with the organic light emitting diode material has a length dimension of least 25 mm.

6. The apparatus according to claim 5 wherein the length dimension of the organic light emitting diode material has a length of between 25 mm and 150 mm.

7. A kit for installing a light fixture comprising:
a. a low profile strip of a planar organic light emitting diode material having a thickness of 10 mm or less;
b. a battery providing a voltage of 10 volts or less;
c. a switch;
d. a securing mechanism;
e. a substrate on which at least said organic light emitting diode material is fixed and to which said battery and said switch is connected;
f. said securing mechanism cooperating with said substrate for removably securing said substrate to a surface to be illuminated;
g. a battery holder for electrical connection between the organic light emitting diode material and the switch; and
f. wherein the combined thickness of the battery, the battery holder, the organic light emitting diode material, and the switch when electrically connected is equal to or less than about 10 mm.

8. The kit according to claim 7, wherein said battery is a rechargeable battery.

9. The kit according to claim 8, further comprising a portable solar battery recharger.

10. The kit according to claim 7, wherein the securing mechanism includes a hook and loop fastener.

11. The kit according to claim 7 wherein a securing mechanism is at least in part connected to at least one of the battery, the switch and the organic light emitting diode material.

12. The kit according to claim 11, wherein the securing mechanism includes an adhesive.

\* \* \* \* \*